United States Patent
DeBeer et al.

(10) Patent No.: US 7,332,814 B2
(45) Date of Patent: Feb. 19, 2008

(54) BONDWIRE UTILIZED FOR COULOMB COUNTING AND SAFETY CIRCUITS

(75) Inventors: Daniel J. DeBeer, San Jose, CA (US); Lance L. Chandler, Toutle, WA (US)

(73) Assignee: Intersil Americas Inc., Milpitas, CA (US)

( * ) Notice: Subject to any disclaimer, the term of this patent is extended or adjusted under 35 U.S.C. 154(b) by 76 days.

(21) Appl. No.: 11/219,274

(22) Filed: Sep. 2, 2005

(65) Prior Publication Data
US 2006/0249822 A1 Nov. 9, 2006

Related U.S. Application Data

(60) Provisional application No. 60/678,602, filed on May 6, 2005.

(51) Int. Cl.
*H01L 23/48* (2006.01)

(52) U.S. Cl. ............... 257/767; 257/239; 257/692; 257/690; 257/E27.016; 257/E27.024

(58) Field of Classification Search ............... None
See application file for complete search history.

(56) References Cited

U.S. PATENT DOCUMENTS 6,150,714 A * 11/2000 Andreycak et al. ......... 257/690
6,424,035 B1 * 7/2002 Sapp et al. ................. 257/723

* cited by examiner

*Primary Examiner*—Sue A. Purvis
*Assistant Examiner*—Scott R. Wilson
(74) *Attorney, Agent, or Firm*—Howison & Arnott, L.L.P.

(57) ABSTRACT

A sense resistor and integrated circuit package combination is disclosed. A package lead frame is provided having a plurality of landing zones associated therewith and a die mounting area for mounting of a die thereon. The die has a plurality of bond pads associated therewith, with a first bond wire connected between a first one of the landing zones and a second one of the landing zones. The first bond wire forms a sense resistor with a resistance of a known value. A second bond wire is connected between the first one of the landing zones and a first one of the bond pads.

12 Claims, 5 Drawing Sheets

BONDWIRE UTILIZED FOR COULOMB COUNTING AND SAFETY CIRCUITS

CROSS-REFERENCE TO RELATED APPLICATIONS

This application claims benefit of U.S. Provisional Application Ser. No. 60/678,602, filed on May 6, 2005, entitled BONDWIRE UTILIZED FOR COULOMB COUNTING AND SAFETY CIRCUITS; by Daniel J. DeBeer and Lance R. Chandler.

TECHNICAL FIELD OF THE INVENTION

The present invention pertains in general to sense resistors utilized to sense current flowing into and out of a battery and, more particularly, to the integration of the sense resistor into the package associated with an integrated circuit charge monitoring device.

BACKGROUND OF THE INVENTION

In order to monitor the "charge state" of a battery during either a charging operation or when it is under load (discharging), it is necessary to determine the number of coulombs that are extracted from the battery or are input to the battery, i.e., the charging current and the discharge current. In order to do this, there must be some way to determine the current into or out of the battery. This is typically facilitated through the use of a sense resistor. This is a small value resistor that is inserted into the current path of the battery. By measuring the voltage across this sense resistor, the current there through can be determined, knowing the value of the resistor. Depending upon the accuracy required, this will determine the precision level required of the sense resistor. This resistor can be utilized for either high-side sensing or low-side sensing. In high-side sensing, the resistor is disposed between the positive or charging source and the battery and, in low-side sensing, the sense resistor is disposed between the negative terminal of the battery and ground.

Typically, the sense resistor is an external resistor to a charge monitoring integrated circuit. Thus, there will typically be required an additional two terminals on the integrated circuit package to accommodate this resistor. Further, this resistor must be large enough such that the voltage developed there across can be measured accurately and it must be able to dissipate the associated I2R losses, thus requiring the resistance value to be as small as possible. The accuracy of the sense resistor directly affects the accuracy of the charge estimation, and this requirement demands resistors with the lowest possible tolerance on the order of 0.1% or less. Ideally, the resistor accuracy must be better than the data converter resolution and, for a 15-bit converter, that is 0.003%. Typical resistor accuracy is on the order of 1% with 0.1% available at premium prices. This sense resistor must also be capable of conducting the full battery current without damage or significant heating. In battery safety circuits, the cost of an external sense resistor cannot be tolerated and the present method for sensing battery current is to use the RdsOn resistance of the FET devices that are fabricated on-chip. This method is extremely inaccurate because RdsOn varies widely from part to part and over temperature. The use of an on-chip resistor is also problematic due to the inaccuracy of the resistor and the large amount of power that must be dissipated on the surface of the chip.

SUMMARY OF THE INVENTION

The present invention disclosed and claimed herein, in one aspect thereof, comprises a sense transistor and integrated circuit package combination. A package lead frame is provided having a plurality of landing zones associated therewith and a die mounting area for mounting of a die thereon. The die has a plurality of bond pads associated therewith, with a first bond wire connected between a first one of the landing zones and a second one of the landing zones. The first bond wire forms a sense resistor with a resistance of a known value. A second bond wire is connected between the first one of the landing zones and a first one of the bond pads.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
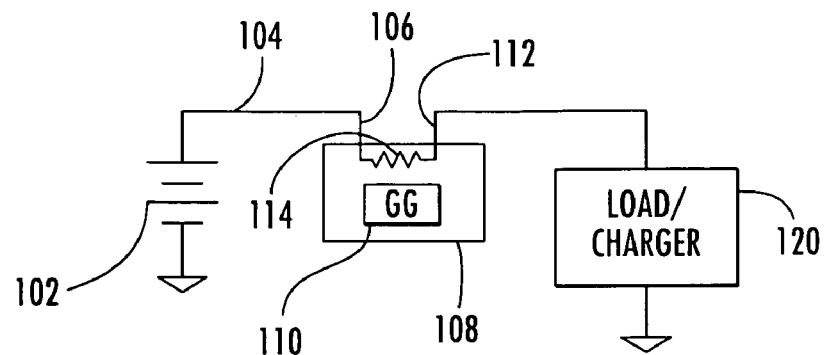
FIG. 1 illustrates an overall block diagram of the integrated circuit with the incorporated sense resistor for use in a battery monitoring operation for a high-side sense mode.

Referring now to the drawings, wherein like reference numbers are used herein to designate like elements throughout the various views, embodiments of the present invention are illustrated and described, and other possible embodiments of the present invention are described. The figures are not necessarily drawn to scale, and in some instances the drawings have been exaggerated and/or simplified in places for illustrative purposes only. One of ordinary skill in the art will appreciate the many possible applications and variations of the present invention based on the following examples of possible embodiments of the present invention.

Referring now to FIG. 1, there is illustrated a diagrammatic view of a battery charging/monitoring system. A battery 102 is provided having a positive terminal connected to a positive battery terminal 104. The positive battery terminal 104 is connected to one terminal 106 of a "gas gauge" integrated circuit 108. The gas gauge integrated circuit 108 is an integrated circuit that includes therein a gas gauge chip 110. This gas gauge chip 110 is operable to monitor the operation of the current supplied into a supply terminal 112 on the integrated circuit 108 through an internal on-chip resistor 114 to the battery terminal 106. This gas gauge operation provided by the chip 110 is operable to determine the state of charge of the battery 102 by measuring coulombs that are input to the battery 102 or extracted therefrom. The supply terminal 112 is connected to either a load for extracting charge from the battery 102 or to a charger for charging the battery 102, this denoted by a block 120. This embodiment of FIG. 1 is what is referred to as high-side sensing, such that it requires two separate terminals, the terminal 106 and the terminal 112, to allow for current to pass through the integrated circuit 108.

Gas gauge chip 110 is a conventional chip that basically senses the voltage across the resistor 114 and determines the current there through. Additional circuitry (not shown) can be used to actually control the charging of the battery 102 in accordance with predetermined charging algorithms. This "meters" the current to the battery 102 during charging. A display can be provided (not shown) that indicates the state of charge of the battery 102. One such gas gauge chip is described in U.S. Pat. No. 5,284,719.

In addition to a gas gauge operation, the integrated circuit 108 could alternately include thereon safety circuitry for terminating delivery of current between terminals 112 and 106 when the current exceeds certain safety thresholds. In order to facilitate the safety operation, it is necessary to measure the current delivered to a battery or a load.

Referring now to FIG. 2, and again with respect to a battery charging/load operation, there is illustrated what is referred to as a "low-side" sensing configuration. In this configuration, the integrated circuit 108 is disposed between the negative terminal of the battery 102 and ground. In this configuration, the resistor 114 has one terminal thereof, a battery connection terminal 122, connected to the negative terminal of the battery 102. The other side of the resistor 114 is connected to a ground terminal 124. In this manner, only a single additional terminal is used for the resistor 114, as the ground terminal 124 is a terminal that is conventionally required on the integrated circuit 108 and constitutes the ground connection for the gas gauge chip 110. Again, the gas gauge chip 110 could be any generic monitoring chip that monitors current from one terminal to another, in this case being from negative terminal battery 102 to the ground terminal 124.

Figure 2:
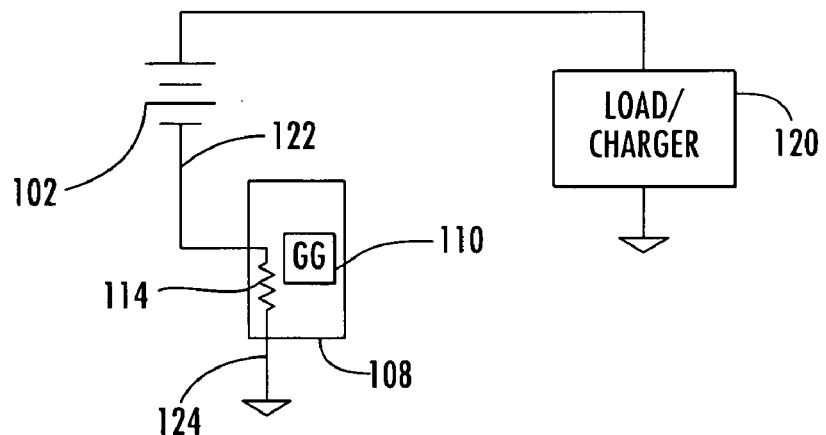
FIG. 2 illustrates the use of the integrated circuit with the incorporated sense resistor for low-side sensing.
Figure 3:
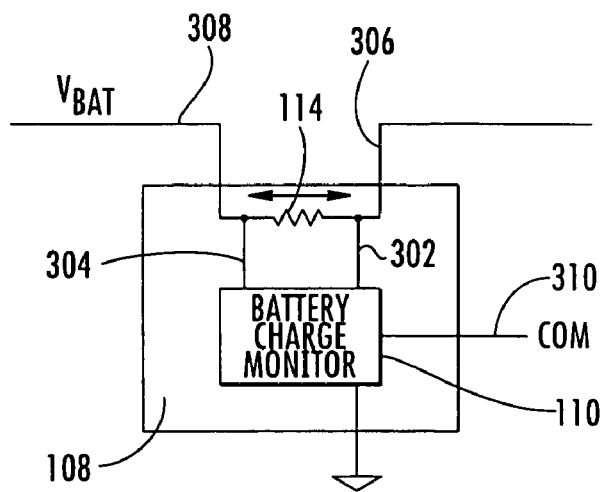
FIG. 3 illustrates a more detailed diagram of the integrated circuit with the incorporated sense resistor.

Referring now to FIG. 3, there is illustrated a more detailed operation of the integrated circuit 108 of FIGS. 1 and 2. The on-chip resistor 114 is operable to be disposed within the integrated circuit package 108 and integral therewith for interface to the actual integrated circuit die 110. The integrated circuit die 110 will have voltage sense nodes 302 and 304 connected to opposite sides of the resistor 114. There will be provided at least two terminals, a terminal 306 associated with one side of resistor 114, that associated with the sense terminal 302, and a terminal 308 associated with the other side of the resistor 114, that associated with the sense terminal 304. In this embodiment, associated with the high-side sense operation, the terminal 308 would be associated with the positive terminal of a battery and the other side, terminal 306, would be associated with the charger or load. In low-side sensing, the terminal 306 would be connected to ground and the terminal 308 would be connected to the negative side of the battery. The battery charge monitor circuit 110, in this high-side operation, would have an internal ground and also would have a communication port 310. The communication port 310 could allow for extraction of battery history data, charge profile storage, etc. Again, these are conventional operations for the gas gauge chips involving some form of serial port communication. The important aspect of this configuration is that the integrated circuit 108 includes thereon within the boundaries of the package, the sense resistor 114. Also, it can also be seen that for high-side sensing, only two terminals are required to interface with the resistor 114, such that current enters the chip and exits the chip and, for low-side sensing, only a single additional terminal is required, since ground will always be required. However, even in low-side sensing, it can be seen that the current must enter the package and leave the package through the resistor 114.

Figure 4:
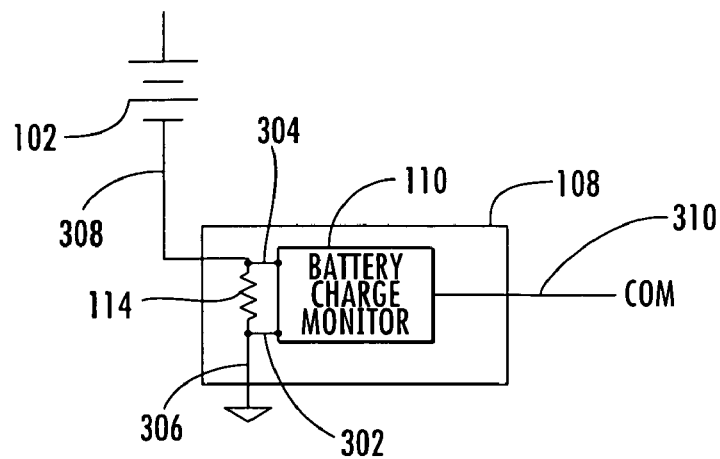
FIG. 4 illustrates a detail of the low-side sensing operation of FIG. 2.

Referring now to FIG. 4, there is illustrated an alternate of the embodiment of FIG. 3 for low-side sensing. In this embodiment, it can be seen that the terminal 306 is connected to ground.

Figure 5:
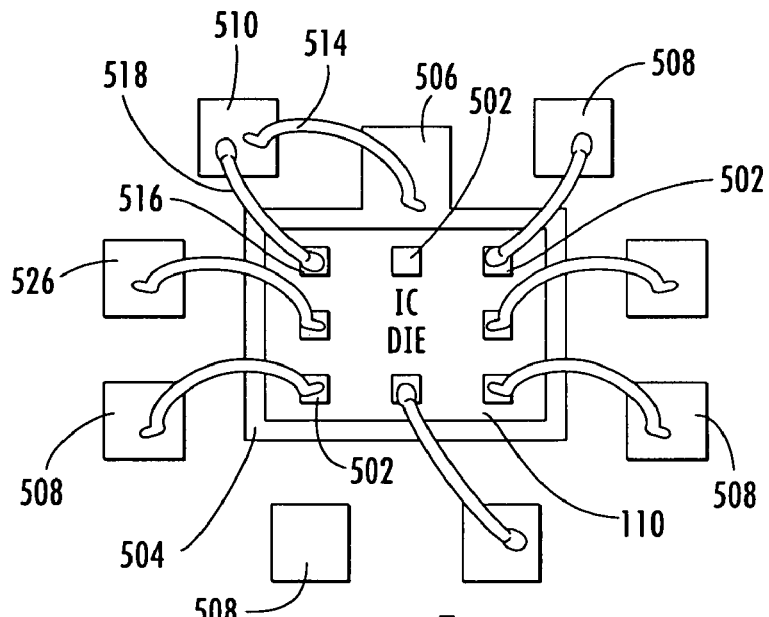
FIGS. 5 and 5a illustrate a top view of the interior of the integrated circuit package and the sense resistor disposed between landing zones.

Referring now to FIG. 5, there is illustrated a layout of the integrated circuit 108 with the packaging (typically a plastic encapsulation) removed to illustrate the layout of the interior of the package. The integrated circuit 108 is formed of an IC die. This die has disposed thereon a plurality of bonding pads 502 at the various regions around the periphery of the IC 110. The bonding pads are operable to have a bond wire attached on one side thereto, and the bond wire on the other side thereof attached to a "landing zone" on a lead frame. From a nomenclature standpoint, a lead frame is a patterned metallic region having associated therewith multiple metal regions, one of which, a region 504, is referred to as a "die bonding pad." This is the region on which the back side of the IC 110 is attached to. The back side of the IC 108 is typically the ground connection. This die bonding region 504 has a protrusion 506 that constitutes a "landing zone" associated therewith. A "landing zone" is an area to which a bond wire is attached and which also interfaces with an external terminal to the package. This terminal can be integral therewith extending outward to one side initially in a planar configuration. They are all interconnected (not shown) at the exterior tips thereto such that, after encapsulating the bonded device, the terminals can be formed into a conventional insertable IC chip configuration or any of multiple other configurations of the IC chip, such as a flip chip configuration, etc. It is important that there be some terminal that extends from the package for interface with external circuitry. Each of these terminals will have a "landing zone" associated therewith for interface to the IC 108 through a bondwire (noting some may be unconnected terminals).

In the illustration of FIG. 5, in addition to the landing zone 506 associated with the underside of the die on the die bonding area 504, a plurality of terminals are provided, each having a landing zone associated therewith. One of these landing zones, a landing zone 510, is associated with one side of the sense resistor 114. The illustration of FIG. 5 is associated with the low-side sensing operation wherein the sense resistor 114 is disposed between one terminal and a ground terminal. The ground terminal is associated with landing zone 506. Therefore, the sense resistor 114 is comprised of a bondwire 514 that is connected between landing zone 510 and landing zone 506. Therefore, current will, for a charging operation, flow into landing zone 510, through bondwire 514 and out of the integrated circuit package from landing zone 506 without flowing through any circuitry on the IC 108 or any part of the surface thereof. Voltage sensing occurs by connecting the landing zone 510 to a bond pad 516 on the integrated circuit 110 by connecting landing zone 510 to bond pad 516 with a bondwire 518. It can be seen that substantially no current flows through bondwire 518 for the voltage sensing operation, as high impedance circuitry on the integrated circuit 108 is associated with the voltage sensing operation. By keeping the bondwire 514 that provides the sense resistor operation from being connected to the bond pad 516, this prevents a high density current from flowing through the bond pad. When large amounts of current are passed through a bond on the end of a bondwire on a bond pad, this can result in deleterious affects. One of these is an effect known as "electro migration." This electro migration can result in silicon migrating into the bonding area due to the high density current. Thus, it is desirable to prevent high currents from existing on the surface of the integrated circuit. By disposing the bondwire 514 that constitutes the resistor 114 for the sensing operation, the high density current is restricted to the landing zones, which landing zones typically are a plated metallic material.

Figure 5A:
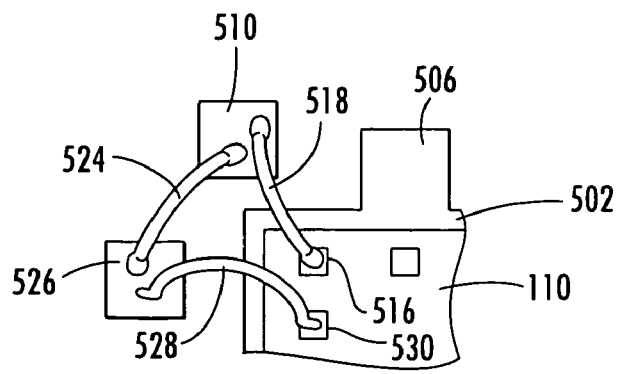

For the high-side sensing operation, illustrated in FIG. 5a, the sense resistor 114 is provided by connecting a bondwire 524 between the landing zone 510 and another landing zone 526. The landing zone 526 and the landing zone 510 both connect to external terminals. For sensing operations, the bondwire 518 still provides one side of the voltage sensing operation to the bond pad 516, whereas a second bondwire, a bondwire 528 is connected between the landing zone 526 and a bond pad 530 on the integrated circuit 108. However, it can be seen that two landing zones and two associated terminals are required for the high-side sensing, as compared to low-side sensing. Still, the sense resistor 114 is provided between two terminals without any surface of the bondwire connecting any surface of the integrated circuit other than for a voltage sensing operation through isolated bondwires.

The bondwire 514 for low-side sensing, and the bondwire 524 for the high-side sensing, provide an accurate resistance value that is temperature stable. The bondwire can be fabricated from a standard aluminum bondwire with a diameter of 1.25 mils, which has a resistance of 34 milli-ohm per mm. The resistivity and temperature properties are defined by the bondwire material and can be varied by selecting different materials for the bondwire. Aluminum, gold and aluminum with 1% silicon are commonly available. The 1% silicon typically is utilized in most bondwires to prevent electro migration when connected to a bond pad on a silicon integrated circuit. The bondwire utilized for the sense resistor can be a different material than the bondwires utilized to connect between landing zones and bond pads on the integrated circuit 110. In addition, it can have a different diameter than that associated with the bondwires to the bond pads. The accuracy of the resistor provided by this bondwire between landing zones depends on the bondwire properties and can be tightly controlled, more tightly than the resistivity of any metal layers on the chip. However, the absolute value of the resistor can vary somewhat due to minor variations in the length of the bondwire and the diameter thereof. As will be described herein below, trimming circuitry is provided on the chip for a programmable trim. It is this stability of the resistor that is desired, as the absolute value can always be trimmed.

Figure 6:
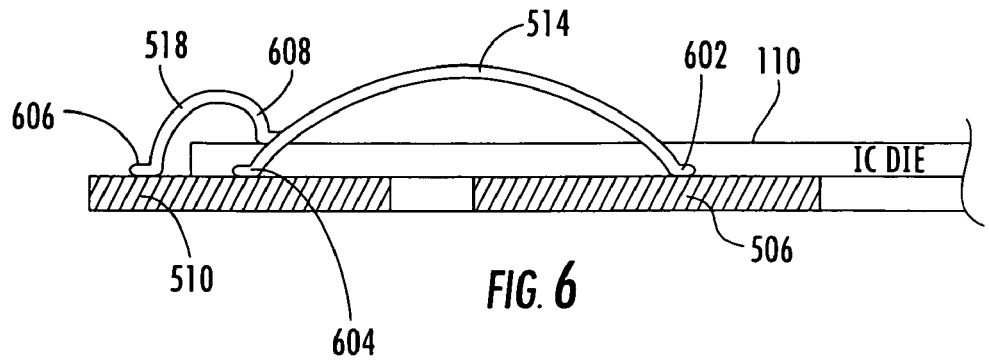
FIG. 6 illustrates a side view of the embodiment of FIG. 5 illustrating the sense resistor.

Referring now to FIG. 6, there is illustrated a side view of the embodiment of FIG. 5. It can be seen that the sense resistor bondwire 514 has a bond 602 that adheres to one end of the bondwire 514 to the protrusion 506 (landing zone) associated with the die bonding area that interfaces with the back side of the die 110. The other side of the bondwire 514 has a bond 604 associated therewith that connects the bondwire 514 to the landing zone 510. The bondwire 518 has a bond 606 associated therewith for connecting one side of the bondwire 518 to the landing zone 510 and a bond 608 for connecting the other side of the bondwire 518 to the bonding pad 516 on the die 110. It can be seen that current flowing into the landing zone 510 from an external terminal (not shown) flows through the bondwire 514 and not through any portion of the die 110.

Figure 7:
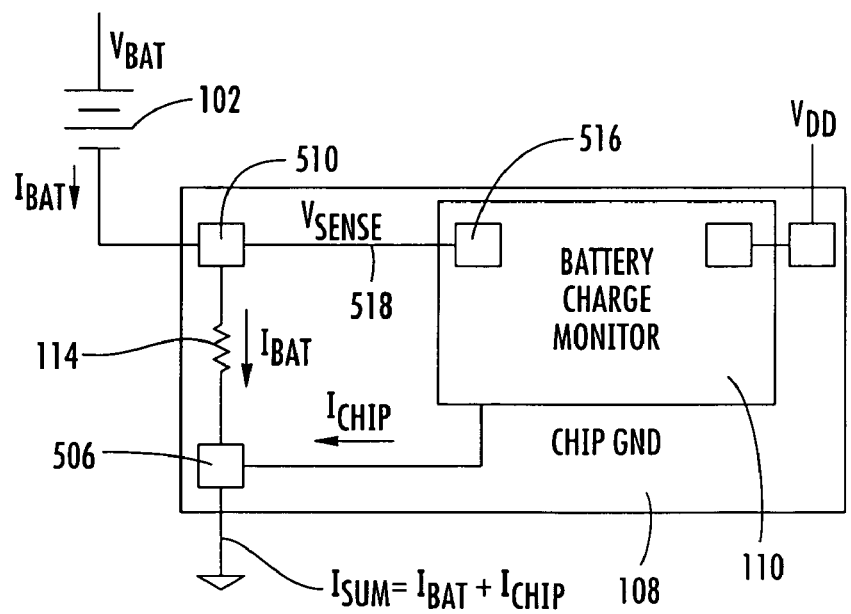
FIG. 7 illustrates a diagrammatic view of the integrated circuit and the interface of the sense resistor with the battery charge monitor integrated circuit.

Referring now to FIG. 7, there is illustrated a detail of the integrated circuit 110 wherein the low-side sensing is illustrated with the negative terminal of the battery connected to the landing zone 510 and the ground terminal connected to the landing zone 506. The bondwire provides the resistor 114 disposed there through. Therefore, the current from the battery 102 during a charging operation will flow into the landing zone 510 at a current level of $I_{BAT}$. This current flows through resistor 114 to landing zone 506 and to ground through the external terminal. The battery charge monitor chip 110, the die, will have the voltage sense provided to the bond pad 516 through the bondwire 518. However, there will be little or no current flowing into the battery charge monitor chip 110. Any current flowing into the chip and to ground will result in some chip current, $I_{CHIP}$ that will flow into the landing zone 506 to ground. The total current exiting the chip through ground will be the sum current of $I_{BAT}$+ $I_{CHIP}$. It can be seen that the bulk of the current from the battery is flowing through resistor 114, without requiring that current flow through any bonding pads on the chip 110 or through circuitry thereon.

Figure 8:
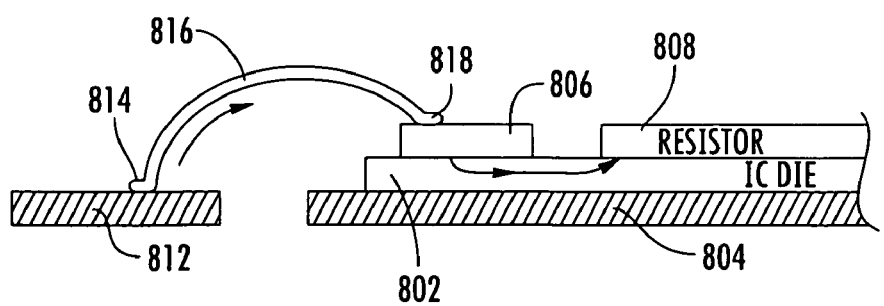
FIG. 8 illustrates a prior art embodiment utilizing an on-chip resistor.

Referring now to FIG. 8, there is illustrated a prior art system wherein an integrated circuit 802 is disposed on a bonding area 804 and contains thereon a bond pad 806 and an on-board resistive device 808. A landing zone 812 has disposed thereon a bond 814 on one side of a bondwire 816, the other side thereof connected to the bond pad 806 with a bond 818. Current flows through the bondwire 816 to the bond pad 806 and then through interconnecting metal runs on the integrated circuit 802 to the resistive device 808. This current flowing through the bond pad and the resistive device 808 on the integrated circuit 802 can result in such things as electro migration due to the high current density. This is an undesirable effect.

Figure 9:
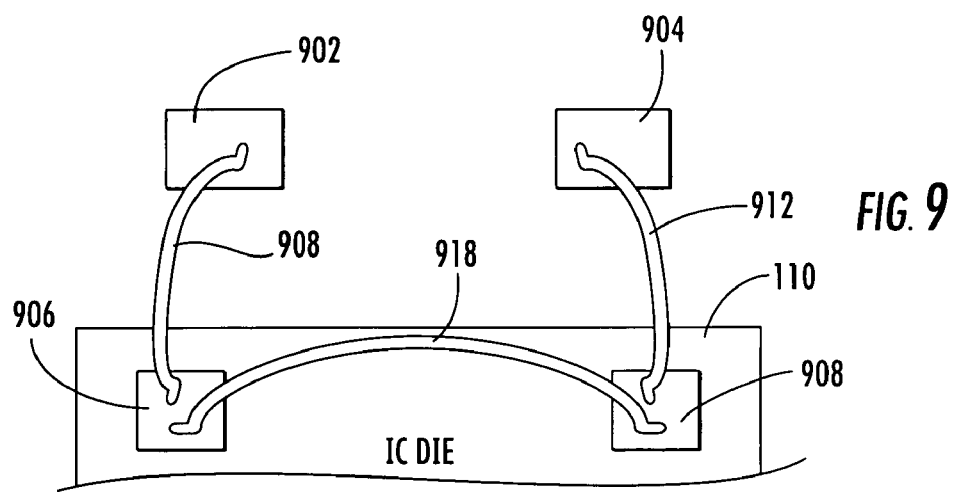
FIG. 9 illustrates an alternate embodiment wherein the sense resistor is disposed between bonding pads.

Referring now to an alternate FIG. 9, there is illustrated an alternate embodiment wherein the sense resistor is disposed between bond pads on the integrated circuit die representing the integrated circuit 110. In this embodiment, there are provided two landing zones 902 and 904. Landing zone 902 is connected to a bond pad 906 on the die 110 through a bondwire 908. Similarly, the landing zone 904 is interfaced to a bond pad 908 on the integrated circuit die 110 through a bondwire 912. These bond pads 906 and 908 are voltage sensing pads and they are interfaced with high impedance circuitry on the integrated circuit. Therefore, no current actually flows through the body of the integrated circuit. However, the sense resistor is provided by a bondwire 918 connected between bond pad 906 and bond pad 908. Although this is not as desirable as connecting the sense resistor bondwire between two landing zones as described herein above, this would still prevent high density current from flowing through the body of the silicon integrated circuit. However, current still must flow from each of the bonds on the associated bond pad between the bondwire from the landing zone and the sense resistor bondwire. Thus, current would be required to flow through the bond pad itself for a very short distance. This could result in some electro migration, but not as great as if it were flowing through the body of the integrated circuit itself.

Figure 10:
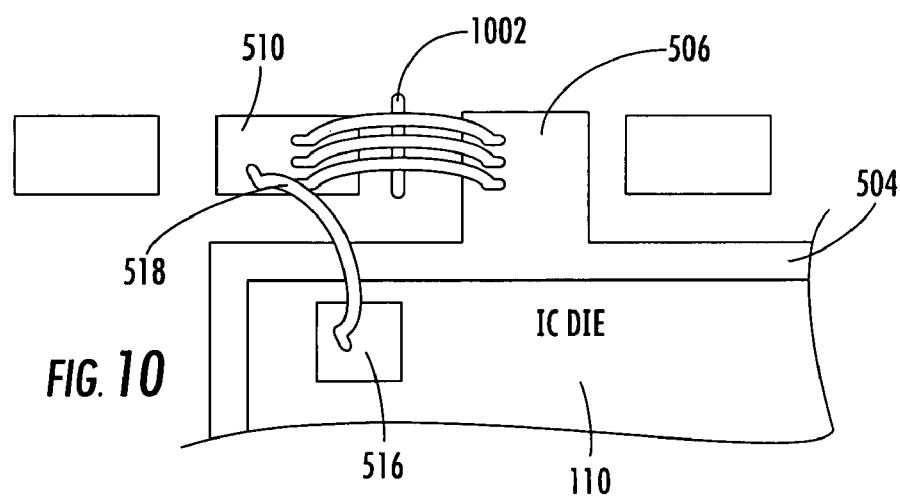
FIG. 10 illustrates an alternate embodiment wherein multiple bond wires are utilized to realize the sense resistor.

Referring now to FIG. 10, there is illustrated an alternate embodiment of the operation for low-side sensing. This embodiment is equally applicable to high-side sensing. In this embodiment, the sense resistor is provided by a plurality of bondwires 1002. This is for the purpose of reducing the overall resistance provided by a single bondwire, provided that a low resistance value is required over that provided by a single bondwire between the landing zone 510 and the landing zone 506. Additionally, it may be that a higher power requirement is necessary. To this end, a longer bondwire could be utilized, or a single bondwire, that would result in a higher resistance. To reduce this resistance and increase in the power handling capacity, parallel bondwires could be utilized or a single, thicker bondwire could be utilized. To adjust the resistance, it is not necessary to dispose the bondwires between adjacent landing zones; rather, the bondwires providing the sense resistor could be disposed between landing zones that are remotely disposed with respect to each other. However, one consideration is overlapping bondwires, since such might cause electrical shorts after packaging.

Figure 11:
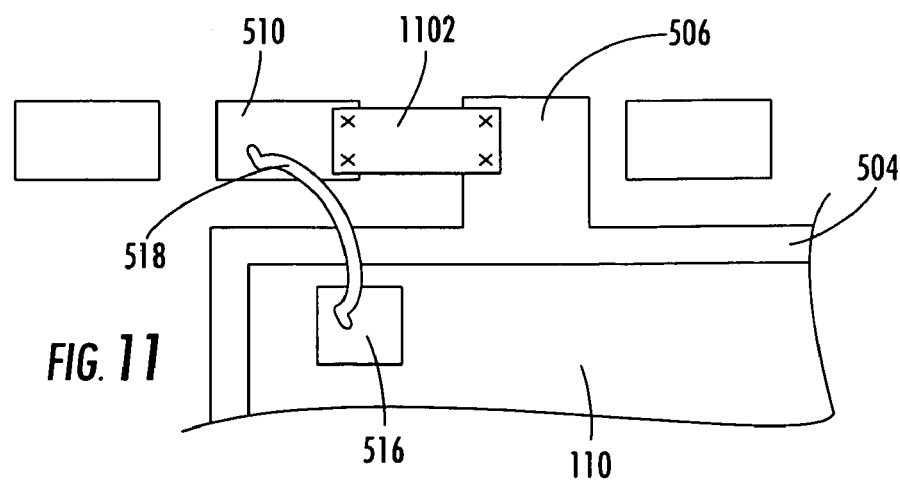
FIG. 11 illustrates an alternate embodiment wherein a metal strip is utilized for the sense resistor that is disposed between landing zones.

Referring now to FIG. 11, there is illustrated an alternate embodiment than that associated with the embodiment of FIG. 10. In this embodiment, rather than utilizing bondwires, a resistive strip of metal 1102 is disposed between adjacent landing zones 510 and 506. This strip is of a material of a defined width and length and resistivity to define the resistance there between. The power handling capability of this material may be superior to that of the bondwire and the main resistance of that strip 1102 can be adjusted. However, the strip 1102 will most likely be connected to adjacent landing zones. It could also be long enough and arched to connect between multiple landing zones. In that configuration, the advantage of a strip is that it may be rigid and would not be subject to the same considerations as a bondwire overlapping multiple landing zones.

Figure 12:
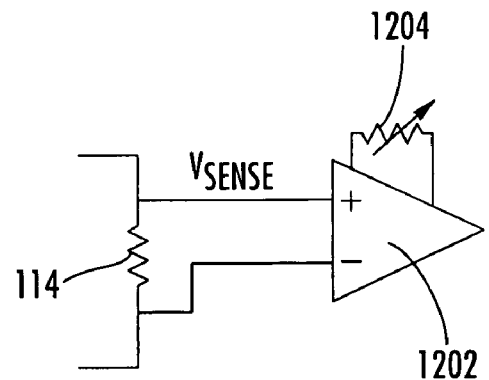
FIG. 12 illustrates a diagrammatic view of a trim circuit for sensing the voltage across the sense resistor.
Figure 13:
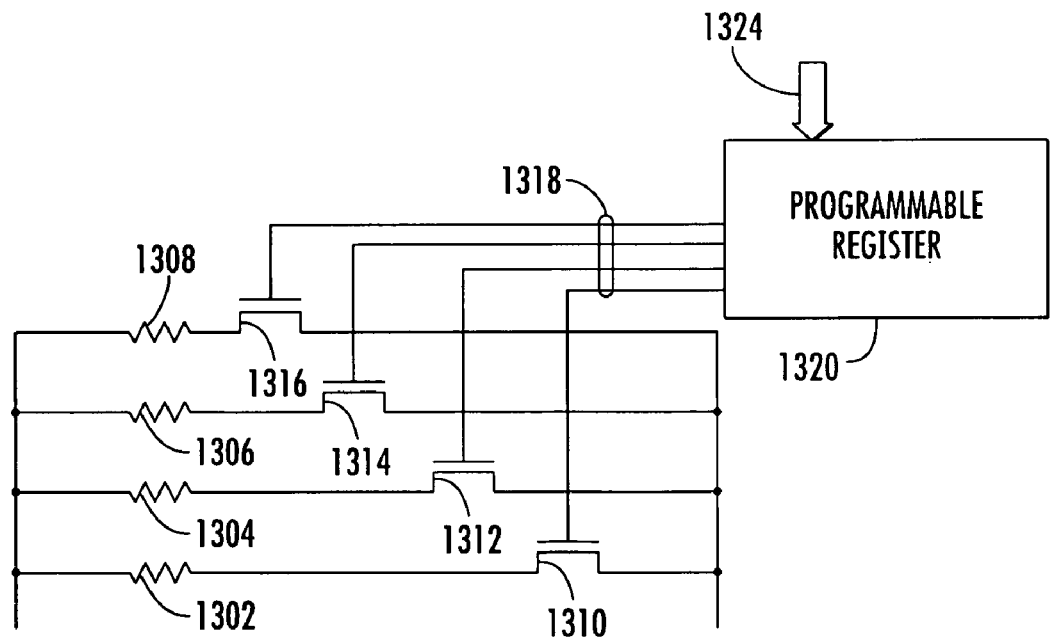
FIG. 13 illustrates a schematic diagram of the trim circuit for the amplifier of FIG. 12.

Referring now to FIG. 12, there is illustrated a diagrammatic view of a voltage sense circuit on the integrated circuit. This is typically comprised of an amplifier 1202 which has positive and negative inputs for being connected across the sense resistor 114. The input to the amplifier 1202 is typically a differential input pair such that the positive and negative inputs are connected to gates of MOS transistors, i.e., very high impedance inputs. Thus, very little current will flow into the amplifier 1202. The amplifier 1202 will measure the differential voltage across the resistor 114 and amplify that voltage by a predetermined amplification factor. In the integrated circuit, there is provided trim circuitry 1204 for trimming the value of the gain in the amplifier 1202. Since the resistivity of the resistor 114 can vary, depending upon the length of the bondwire, the gain of the amplifier 1202 could be varied in a one time programmable manner to provide an offset or compensation for any variations. This trimming operation for adjusting the gain is conventional and can take many forms. One form is that illustrated in FIG. 13. In FIG. 13, the trimming is facilitated with a programmable selection of resistors. In this embodiment, there are illustrated four resistors 1302, 1304, 1306 and 1308. These are possibly binary weighted resistive values that are selected with associated transistor switches 1310, 1312, 1314 and 1316, respectively. The gates of transistors 1310-1316 are connected to a four-bit bus 1318 which is connected to the output of a programmable register 1320. The programmable register 1320 receives a value on a databus 1324 for programming the contents thereof. During a calibration procedure at the factory, the content of this register can be determined and then fixed. In some systems, laser trimming fuses can be utilized to provide this programming. Additionally, new technology utilizes a one-time programmable (OTP) flash programmable memory that is operable to have the value thereof adjusted and then fixed at the factory such that it can never be changed. Since the bondwire 114 does not change after the fabrication of the integrated circuit and is temperature stable, it is only necessary to make this adjustment one time.

It will be appreciated by those skilled in the art having the benefit of this disclosure that this invention provides a sense resistor integrated into an integrated circuit package. It should be understood that the drawings and detailed description herein are to be regarded in an illustrative rather than a restrictive manner, and are not intended to limit the invention to the particular forms and examples disclosed. On the contrary, the invention includes any further modifications, changes, rearrangements, substitutions, alternatives, design choices, and embodiments apparent to those of ordinary skill in the art, without departing from the spirit and scope of this invention, as defined by the following claims. Thus, it is intended that the following claims be interpreted to embrace all such further modifications, changes, rearrangements, substitutions, alternatives, design choices, and embodiments.

What is claimed is:

1. A sense resistor and integrated circuit package, comprising:
   a package lead frame having a plurality of landing zones associated therewith and a die mounting area for mounting of a die thereon, said die having a plurality of bond pads associated therewith;
   a first bond wire connected between a first one of said landing zones and a second one of said landing zones, wherein said second one of said landing zones is associated with said die mounting area, said first bond wire forming a sense resistor with a resistance of a known value;
   wherein said second one of said landing zones is associated with system ground, wherein current flowing into said first one of said landing zones to ground through said first bond wire generates a voltage there across that is sensed at said first bond pad in a low side sensing operation; and
   a second bond wire connected between said first one of said landing zones and a first one of said bond pads.

2. The sense resistor and integrated circuit package of claim 1, and further comprising a plurality of bond wires in parallel to said first bond wire.

3. The sense resistor and integrated circuit package of claim 1, wherein said first and second bond wires are fabricated from different materials.

4. The sense resistor and integrated circuit package of claim 1, wherein said first and second bond wires are different diameters.

5. The sense resistor and integrated circuit package of claim 1, wherein said second landing zone is interfaced with said die, said die having voltage sense circuitry thereon for sensing the voltage across said first bond wire.

6. The sense resistor and integrated circuit package of claim 5, wherein said voltage sense circuitry has trim circuitry associated therewith for effectively trimming the resistance value of said first bond wire.

7. A sense resistor and integrated circuit package, comprising:
- a package lead frame having a plurality of landing zones associated therewith and a die mounting area for mounting of a die thereon, said die having a plurality of bond pads associated therewith;
- a resistive connection disposed between a first one of said landing zones and a second one of said landing zones, wherein said second one of said landing zones is associated with said die mounting area, said resistive connection forming a sense resistor with a resistance of a known value between said first and second landing zones;
- wherein said second one of said landing zones is associated with system ground, wherein current flowing into said first one of said landing zones to ground through said first bond wire generates a voltage there across that is sensed at said first bond pad in a low side sensing operation; and
- a first bond wire connected between said first one of said landing zones and a first one of said bond pads.

8. The sense resistor and integrated circuit package of claim 7, wherein said first and second landing zones are adjacent each other.

9. The sense resistor and integrated circuit package of claim 7, wherein said first and second bond wires are different diameters.

10. A sense resistor and integrated circuit package, comprising:
- a package lead frame having a plurality of landing zones associated therewith and a die mounting area for mounting of a die thereon, said die having a plurality of bond pads associated therewith;
- a resistive connection disposed between a first one of said landing zones and a second one of said landing zones, wherein said resistive connection does not comprise a portion of the package lead frame, said resistive connection forming a sense resistor with a resistance of a known value between said first and second landing zones; and
- a first bond wire connected between said first one of said landing zones and a first one of said bond pads.

11. The sense resistor and integrated circuit package of claim 10, and further comprising a second bond wire connected between said second landing zone and a second bond pad on said die, wherein current flowing into said first one of said landing zones from external to the integrated circuit package to said second one of said landing zones through said resistive connection generates a voltage there across that is sensed at said first and second bond pads in a high side sensing operation with substantially no current flowing through said first and second bond pads.

12. The sense resistor and integrated circuit package of claim 10, wherein said second one of said landing zones is associated with system ground, wherein current flowing into said first one of said landing zones to ground through said first bond wire generates a voltage there across that is sensed at said first bond pad in a low side sensing operation.

* * * * *